United States Patent [19]

Trumpp et al.

[11] Patent Number: 4,894,651

[45] Date of Patent: Jan. 16, 1990

[54] BROADBAND SIGNAL SWITCHING EQUIPMENT

[75] Inventors: Gerhard Trumpp, Puchheim; Wilhelm Koenig, Munich; Thomas Lang, Taufkirchen, all of Fed. Rep. of Germany

[73] Assignee: Siemens Aktiengesellschaft, Berlin and Munich, Fed. Rep. of Germany

[21] Appl. No.: 62,677

[22] Filed: Jun. 16, 1987

[30] Foreign Application Priority Data

Jun. 19, 1986 [DE] Fed. Rep. of Germany ....... 3620468

[51] Int. Cl.[4] .............................................. H04Q 9/00
[52] U.S. Cl. ........................... 340/825.91; 340/825.87; 307/241; 307/530
[58] Field of Search ....................... 340/825.85–825.93, 340/825.79; 379/291, 292, 54, 94; 370/58; 307/530, 350, 352–354, 358, 359, 362–363, 279, 290–291, 468–469, 241; 328/162, 151; 330/306

[56] References Cited

U.S. PATENT DOCUMENTS

| | | |
|---|---|---|
| 3,938,049 | 2/1976 | Acker et al. |
| 3,980,831 | 9/1976 | Mertel. |
| 4,316,105 | 2/1982 | Fowler ................................ 307/362 |
| 4,434,381 | 2/1984 | Stewart ............................... 307/530 |
| 4,446,552 | 5/1984 | Tweedy ............................... 370/58 |
| 4,521,695 | 6/1985 | Mazin et al. ........................ 307/279 |
| 4,539,551 | 9/1985 | Fujita et al. ........................ 307/362 |
| 4,560,890 | 12/1985 | Masuda et al. ..................... 307/352 |
| 4,745,409 | 5/1988 | Hofmann ........................ 340/825.87 |
| 4,746,921 | 5/1988 | Hofmann ........................ 340/825.91 |
| 4,785,299 | 11/1988 | Trumpp ......................... 340/825.91 |
| 4,792,801 | 12/1988 | Hofmann ........................ 340/825.91 |

FOREIGN PATENT DOCUMENTS 2365263 4/1978 France.

OTHER PUBLICATIONS

Sunazawa et al., "Wideband Integrated Crosspoint Switch Matrix", Jan.–Feb., 1977, Review of the Electrical Communication Laboratories, vol. 25, Nos. 1–2, pp. 43–51.
"Switching Matrix Delivers 100 Mb/s," Gallagher, Electronics, Dec. 15, 1983, pp. 88 & 90.
"Arbeitsgeschwindigkeitsgrenzen von Koppelnetzwerken fur Breitband–Digitalsignale," Pfannschmidt (Dissertation) 1978.

Primary Examiner—Donald J. Yusko
Assistant Examiner—Edwin C. Holloway, III
Attorney, Agent, or Firm—Hill, Van Santen, Steadman & Simpson

[57] ABSTRACT

Switch elements having a relatively high forward resistance are provided in a broadband signal switching equipment comprising a crosspoint matrix constructed in FET technology and having input driver circuits and output amplifier circuits. The output amplifier circuits each include a cascade network of a CMOS inverter and a D flip-flop, and a switch having a relatively low forward resistance by which the line leading from the switch element to the inverter input is at least approximately reloaded to the potential corresponding to the switching threshold of the inverter. The switch element is reloaded in a preliminary phase of a bit switching time interval, in order, proceeding from that potential, to be reloaded in the following primary phase to the potential corresponding to the respective bit connected therethrough.

8 Claims, 3 Drawing Sheets

BROADBAND SIGNAL SWITCHING EQUIPMENT

BACKGROUND OF THE INVENTION

1. Field of the Invention

The present invention relates to broadband switching equipment comprising a crosspoint matrix constructed in field effect transistor technology at whose inputs a respective input driver circuit can be provided and at whose outputs respective output amplifiers is provided.

2. Description of the Prior Art

Recent developments in telecommunications technology have led to service-integrated communications transmissions and switching systems for narrow band and broadband communications services which provide light waveguides as the transmission media in the region of the subscriber lines by way of which both the narrow band communications services such as, in particular, 64 kbit/s digital telephony, as well as broadband communications services such as, in particular, 140 Mbit/s picture technology are conducted, whereby, however, dedicated band signal switching equipment and broadband signal switching equipment are provided in the exchanges (preferably comprising shared control device, as in U.S. Pat. No.39 80 831, (German Pat. No. 24 21 002)).

In conjunction with a broadband signal time-division multiplex switching system whose crosspoints are utilized in time-division multiplex for a respective plurality of connections, it is known to connect, respectively, two lines with the assistance of a gate which is switched on and off by a crosspoint-associated memory cell constructed as a bistable D flip-flop, whereby the crosspoint associated memory cell, whose clock input is supplied with a corresponding clock signal, is driven in only one coordinate direction, namely at its D input as disclosed in Pfannschmidt: "Arbeitsgeschwindigkeitsgrenzen von Koppelnetzwerken fuer Breitband-Digitalsignale", Diss. Braunschweig 1978, FIGS. 6.7 and 6.4. In view of a time-division multiplex factor of about 4–8, which can be achieved in view of a bit rate of 140 Mbit/s, and in view of the involved circuit technology thereby required, however, exclusive space-division switching facilities are presently preferred for switching broadband signals, the connections which are established by way of the crosspoints being separated from one another only spatially.

An exclusive broadband signal space-division switching matrix network can be constructed as a crosspoint matrix in complementary-metal-oxide-semiconductor (CMOS) technology provided with input amplifiers and output amplifiers in whose crosspoints the switching elements are respectively controlled by a decoder-controlled, crosspoint-associated holding memory cell, whereby the switch elements are respectively constructed as a CMOS transfer gate (CMOS transmission gate; ISS'84 Conference papers 23Cl, FIG. 9); the crosspoint-associated holding memory cells of an exclusive space-division switching matrix can be driven in two coordinates proceeding from a row decoder and from a column decoder, being respectively driven via a row-associated or, respectively, a column-associated select line (Pfannschmidt, Op. Cit., FIG. 6.4). Output amplifiers provided in a switching matrix can also be activated dependent on the activation of at least one crosspoint of the appertaining matrix line, as set forth in the French Pat. No. 2,365,263, FIG. 5.

It is likewise known, in general, for example from Electronics, Dec. 15, 1983, pp. 88–89, to provide digital crosspoints in the form of tristate inverters in a broadband crosspoint matrix, the specific realization of these tristate inverters being thereby unresolved, but at least requiring a plurality of transistors.

A particularly low transistor expense in the specific realization of the individual crosspoints is comprised by a broadband signal space-division switching system, as disclosed in co-pending U.S. application Ser. No. 013,069, filed Feb. 10, 1987 (Trumpp)–comprising a crosspoint matrix in FET technology whose switch elements are respectively controlled by a decoder-control, crosspoint-associated memory cell wherein the switch elements are respectively formed by a single n-channel transistor charged at its gate electrode with a switching potential which exceeds the upper limit value of a signal to be through-connected by more than the transistor pinch-off voltage or, respectively, is charged with an inhibit potential falling below the level derived by increasing the lower limit level of a signal to be through-connected by the transistor pinch-off voltage. Switch elements provided in a crosspoint matrix and respectively controlled in a simple manner by a crosspoint-associated holding memory cell can therefore be realized with minimum transistor expense, without inverters and without a p-channel transistor to be provided in a CMOS transfer gate which requires a larger area because of its higher specific resistance and, therefore, can be realized with a correspondingly-low space requirement and with correspondingly-low switch capacitances, this being particularly important with respect to integration. An additional reduction in the size of the circuit and, therefore, of the space requirement for such a crosspoint occurs with the crosspoint-associated memory cell driven in two coordinate directions by two selection decoders (row decoder, column decoder), this memory cell being formed by an n-channel transistor and two cross-coupled inverter circuits whose one input is connected to the appertaining decoder output of the one selection decoder via the n-channel transistor which is, in turn, charged at its control electrode with the output signal of the appertaining decoder output of the other selection decoder and whose one's output is connected to the control input of the appertaining switch element.

Arbitrary, asynchronous signals having bit rates up to the order of magnitude of 170 Mbit/s and, therefore, in particular, what is referred to as a signal (for instance, a 140 Mbit/s signal) filling what is referred to as an H4 channel can be respectively through connected between an input and an output (or, given distribution services, a plurality of outputs) via such a proposed, broadband signal spaced-division switching system comprising a crosspoint matrix constructed in FET technology having, for example, 64 inputs and 32 outputs. Meantime, the requirement arises that not only should a respective, entire H4 channel be able to be switched, but sub-channels, for example what are referred to as H3 channels for, for example, 34 Mbit/s signals, should also be capable of being switched. Such a subchannel switching can be fundamentally achieved with the assistance of demultiplexers dividing the respective H4 channel into its H3 subchannel which precede the switching equipment and with the assistance of multiplexers which again combine the subchannels to form a channel following the switching, whereby the switching equipment itself respectively switches the individual subchannels by themselves; this, however, assumes a corresponding multiplication of the inputs and outputs of the crosspoint matrix which, for example, must then comprise 256×128 crosspoints instead of only 64×32 crosspoints in the example. The requirement for complete distribution service capability of the crosspoint matrix thereby raises the problem that each of the inputs (256 inputs in the example) of such a crosspoint matrix must be capable of being simultaneously loaded by all outputs (128 in the example) of the crosspoint matrix. This would require 256 input driver circuits of excessively large size whose cross-currents and dissipated power, however, would considerably complicate the feasibility of such a crosspoint matrix module.

SUMMARY OF THE INVENTION

In view of the foregoing, the object of the present invention is to provide a broadband signal switching system which is capable of meeting the requirements outlined above without involving such difficulties.

The present invention is directed to a broadband signal switching equipment comprising a crosspoint matrix constructed in FET technology at whose inputs a respective input driver circuit can be provided and whose outputs are respectively provided with an output amplifier circuit. Such a broadband signal switching equipment, according to the present invention, is particularly characterized in that the crosspoint are formed with switch elements comprising a high forward or, internal resistance in the through-connected (conducting) condition when compared to an internal resistance effective at a matrix input, and in that the output amplifier circuits respectively comprise a cascade network (chain network) of at least one inverting CMOS logic element, preferably a CMOS inverter, and a holding element, preferably a D flip-flop, inserted into the associated output line, and comprise a switch having its one primary electrode lying at the logic element input and having a low forward resistance in comparison to the resistance of a switch element. The control electrode of this switch, potentially together with the clock input of the D flip-flop, is charged with a switching matrix network switching clock which subdivides a bit switching time interval into a preliminary phase and into the actual switching phase (ph). By way of the switch, the associated output line of the crosspoint matrix is reloaded in every preliminary phase at least approximately to the potential corresponding to the switching threshold of the logic element in order, proceeding from this potential, to be reloaded via the respective switch element in the following switching phase to the potential corresponding to the bit respectively through-connected therewith.

Sense amplifiers operating on what is referred to as the auto-zero principle are known for example, from U.S. Pat. No. 4,434,381.

The present invention, which makes use of the fact that a CMOS logic element exhibits a high voltage gain in the proximity of its switching threshold, offers the advantage that even a small signal increase, which does not yet make excessive demands of the input driver circuits and their cross-currents and dissipated powers, and a small reloading of the output line sections respectively leading to the logic element input thereby affected suffices in order to effect an unambiguous transition of the digital signal from the respectively one signal state to the other signal state at the respective logic element output and, therefore, on the output line section continuing therefrom.

In accordance with another feature of the invention, the other primary electrode of the switch can thereby lie at the output of the logic element. Alternatively, however, it is also possible that the other primary electrode of the switch lies at the output of the special reference voltage generator which, in accordance with a further feature of the invention, can be formed with a fed-back CMOS inverter dimensioned in the same manner as an inverter with which the logic element of the iterative network is formed and which can, as warranted, also serve as a shared reference voltage generator for a plurality of switches.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
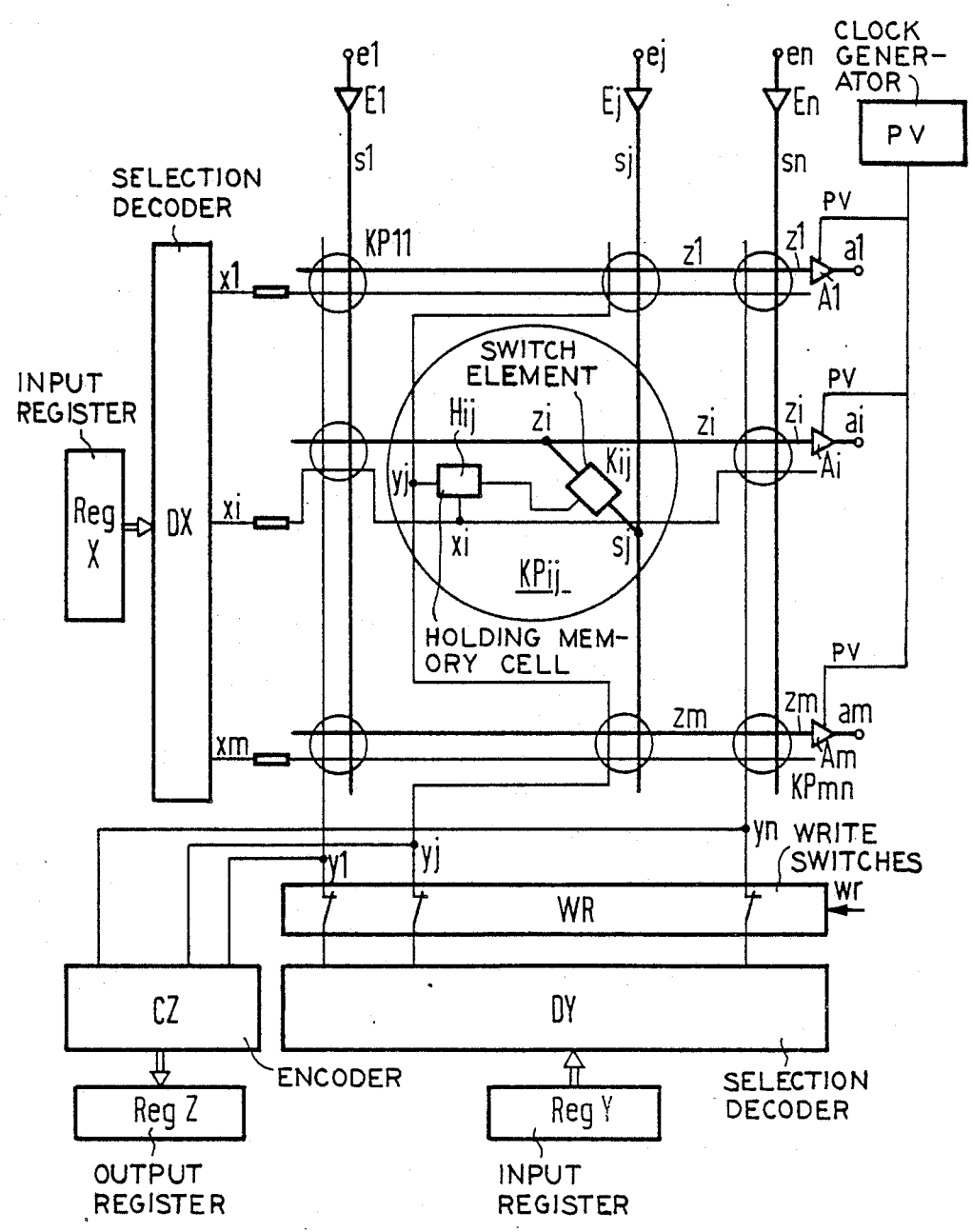
FIG. 1 is a schematic illustration of a broadband switching equipment, comprising crosspoints, constructed in accordance with the present invention.

Referring to FIG. 1, the drawing shows a schematic representation of a broadband signal switching equipment in a scope required for an understanding of the invention as comprising input driver circuits $El \ldots Ej \ldots En$ to be provided at the inputs $el \ldots ej \ldots en$ and leading to column lines $sl \ldots sj \ldots sn$ of a crosspoint matrix and the outputs $al \ldots ai \ldots am$ thereof reached by the row lines $zl \ldots zi \ldots zm$ of the crosspoint matrix to be provided with output amplifier circuits $Al \ldots Ai \ldots An$. The crosspoint matrix comprise crosspoints $KPll \ldots KPij \ldots KPmm$ whose switch elements, as indicated in greater detail at the crosspoint $KPij$ for the switch element $Kij$ thereof, are respectively controlled by a crosspoint-associated holding memory cell $Hij$ (at the crosspoint $KPij$) whose output leads to the control input of the respective switch element ($Kij$ at the crosspoint $KPij$).

In accordance with FIG. 1, the holding memory cells $Hji$ are selected in two coordinates by two selection decoders, namely a row decoder DX and column decoder DY via corresponding selection lines $xl \ldots xi \ldots xm; yl \ldots yj \ldots yn$.

As may be seen from FIG. 1, the two selection decoders DX, DY are connected to input registers Reg X, Reg Y which may be respectively charged by a crosspoint row or, crosspoint column address shared by a matrix line (row or column) crosspoints, in response to which they output a respective "1" selection signal to the selection line corresponding to the respective crosspoint line address. The coincidence of a row selection signal "1" and a column selection signal "1" at the intersection of the selected matrix row with the selected matrix column sets a corresponding connection by activation of the holding memory cell located at the crosspoint, for example the holding memory cell Hij. The associated switch element, the switch element Kij in this example, controlled by the holding memory cell thereby becomes conductive. To inhibit (i.e., return to a non-conducting state) the switch element Kij considered in the present example to clear the connection, the selection decoder DX of the input register Reg X is again (or still) charged with the associated row address, so that the row decoder DX again outputs a row selection signal "1" output line xi and, simultaneously, the column decoder DY is charged proceeding from its input register Reg Y with, for example, a blank address or with the address of a column of unconnected crosspoints, so that it outputs a column selection signal "0" onto its output line yj. The coincidence of a row selection signal "1" and a column selection signal "0" causes the resetting of the holding memory cell Hij, with the result that the switch element Kij controlled thereby is inhibited.

Figure 2:
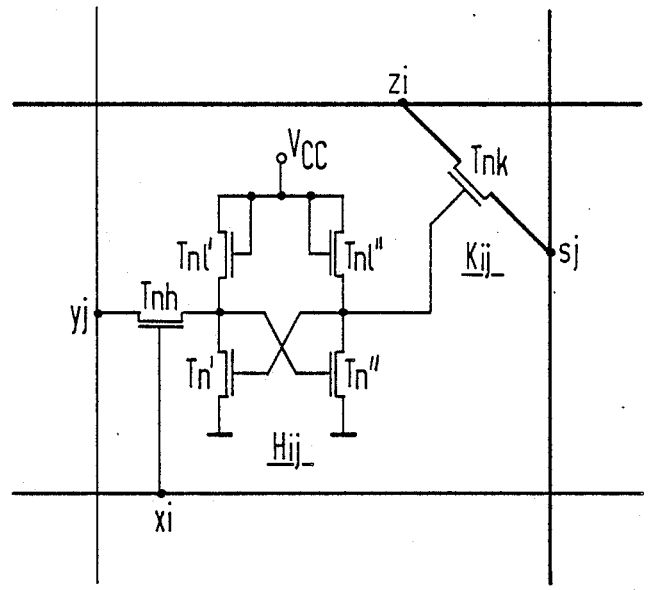
FIG. 2 is a schematic representation of a crosspoint of the type illustrated in FIG. 1.

As may be seen from FIG. 2, the memory cell Hij selected in two coordinates by the two selection decoders (row selection decoder DX and column selection decoder DY in FIG. 1) can be formed by an n-channel transistor Tnh and by two cross-coupled inverter circuits Tn', Tnl'; Tnl'' of which one (Tn', Tnl') has its input side connected to the associated decoder output yj of the one selection decoder (DY in FIG. 1) via the n-channel transistor Tnh which, in turn, has its control electrode charged with the output signal of the associated decoder output xi of the other selection decoder (DX in FIG. 1), and has its output side leading to the control input of the associated switch element Kij.

The switch element Kij, for example, can be formed with a tristate driver or, as likewise illustrated in FIG. 2, by a single n-channel transistor Tnk which has its gate electrode charged with a forward potential ("H" level) exceeding the upper limit value of a signal to be throughconnected between the column line (input line) sj and the row line (output line) zi by more than the transistor pinch-off voltage or, respectively, has its gate electrode charged with an inhibit voltage ("L" level) which falls below the level established by boosting the lower limit value of a signal to be through-connected between a column line (input line) sj and a row line (output line) zi by the transistor pinch-off voltage. Such realization of holding memory cell Hij and switch element Kij have been disclosed in the aforementioned co-pending application Ser. No. 013,069. The only thing essential is that the forward resistance of such a switch element be high in comparison to the internal resistance of the input driver circuit Ej (FIG. 1) provided at the matrix column line sj which is effective at the matrix column line sj, this being capable of being easily realized by an appropriate design of the transistor geometry.

It is also indicated in FIG. 1 that the outputs of the column decoder DY are followed by write switches WR which may be closed given receipt of a write instruction on an enable line wr and through-connect the "1" selection signal ("L") potentially appearing at a decoder output and the "0" selection signals ("H") appearing at the remaining decoder outputs through to the individual column selection line yl, ... yj, ... yn in a low-resistance fashion, so that the switch elements respectively selected in the manner set forth above proceed into their transmissive or, respectively, inhibited condition.

When, by contrast, the switch state of a row of crosspoints of the crosspoint matrix is to be only read, to which end the associated row selection line, for example, the line xi, is again charged with a "1" selection signal ("H") as in call set or call clear, then, as a result of the lack of a write instruction appearing on the enable line WR, the write switches wr remain open with the result that the column selection line yl, ... yj ... yn now do not receive any control potential proceeding from the column decoder DY. By way of the n-channel transistors Tnh (FIG. 2) in the holding memory cell Hij of the associated crosspoint row KPij, the n-channel transistors Tnh being nonetheless unlocked by the row selection signal "H" proceeding to their gate electrodes, a signal state then just prevailing in the holding memory cell Hij can be connected through to the respective column selection line (yj in FIG. 2), whereby a "L" potential must not appear on more than one column selection line yl. . . yj. . . yn (FIG. 1) given faultless operation. As likewise indicated in FIG. 1, the address of this column selection line and, therefore, the address of the associated crosspoint can be acquired with the assistance of an encoder CZ and can be forwarded from the encoder to the following register Reg Z.

Figure 3:
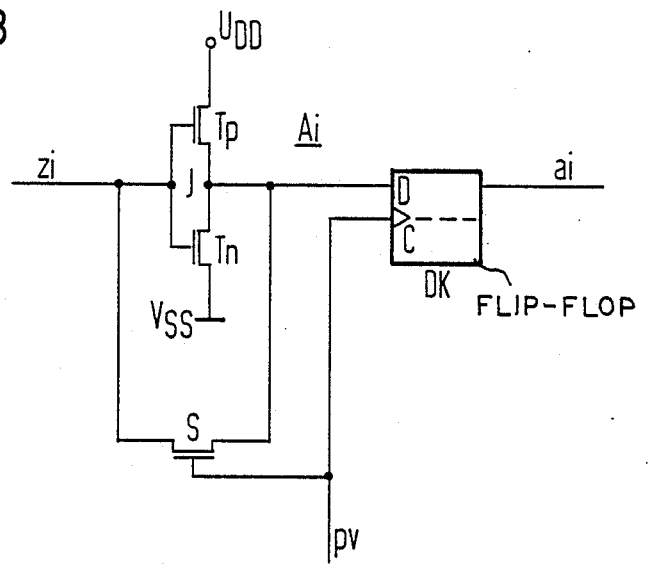
FIG. 3 is a schematic representation of a first embodiment of a circuit for realizing the invention.
Figure 4:
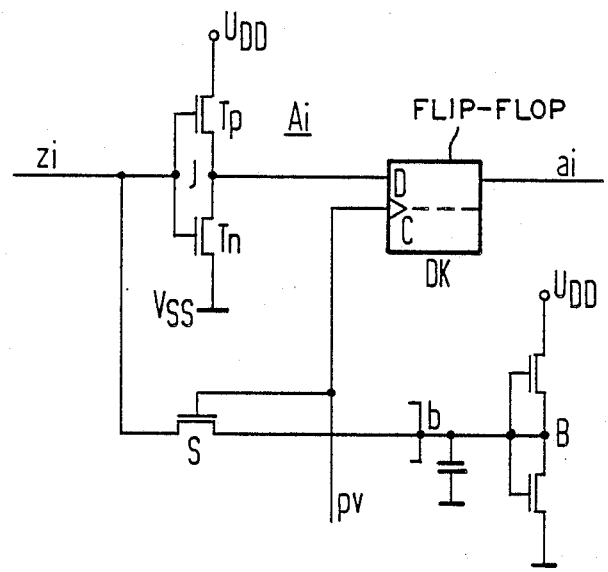
FIG. 4 is a schematic representation of a second embodiment of a circuit for realizing the present invention.

As also shown in FIGS. 3 and 4, the output amplifier Ai (FIG. 1) provided between a row line zi (FIG. 1 and FIG. 2) and the following output ai (FIG. 1) of the crosspoint matrix may consist of a network including a CMOS inverter J formed with two MOS transistors Tp, Tn and an edge-controlled D flip-flop DK which is inserted between the associated output line sections zi and ai, and also comprises a switch formed with a further MOS transistor S whose forward resistance is low in comparison to the forward resistance of a switch element Kij (FIGS. 1 and 2). The switching transistor S has its one primary electrode connected to the input zi of the inverter J; together with the clock input C of the D flip-flop DK, its control electrode is connected to a clock line charged by a clock generator PV with a clock signal pv' subdividing a bit switching time interval in the manner indicated at the bottom of FIG. 5 into a preliminary phase pv and a primary phase ph, the clock signal pv' being likewise indicated in FIG. 5 at the bottom.

In the output amplifier Ai shown in FIG. 3, the other primary electrode of the switching transistor S lies at the output of the inverter J and, therefore, at the input D of the D flip-flop DK. During the preliminary phase pv (see FIG. 5, bottom), the switching transistor S connecting the output of the inverter J to its input is transmissive, so that the matrix row line zi leading to the inverter input is loaded to a potential corresponding to the switching threshold of the inverter J. Proceeding therefrom, the matrix row line zi leading to the input of the inverter J is reloaded from the associated column line sj (FIGS. 1 and 2) via the switch element Kij (FIGS. 1 and 2) to the potential corresponding to the bit which is through-connected therewith, being reloaded in the following primary phase ph (FIG. 5, bottom) in which the switching transistor S is inhibited. Since the inverter J comprises a high-voltage gain in the region of its switching threshold, a low reloading of the matrix row line zi already suffices in order to effect a potential, unambiguous transition of the digital signal from the one signal state into the other signal state at the inverter output (input D of the D flip-flop DK). This signal state is then accepted by the D flip-flop DK at the end of the primary phase with the clock edge and, therefore, is established at the appertaining output ai of the switching equipment.

The resistance of the two inverter transistors Tp, Tn must be lower as the potential of the matrix row line zi comes closer to the switching threshold of the inverter J during the preliminary phase pv, to be referred to as the auto-zero phase. The inverter cross-current nonetheless connected therewith and the dissipated power resulting therefrom can be reduced when the inverter J is designed with high values of resistance, whereby a difference in potential then remains between the potential reached at the inverter input zi and the inverter switching threshold at the beginning of the primary phase ph (FIG. 5, bottom), the line reloading requiring still more time on the basis of this difference in potential until the switching threshold is exceeded. An optimization must therefore be undertaken in the circuit dimensioning between the criteria of dissipated power and switching time.

Figure 5:
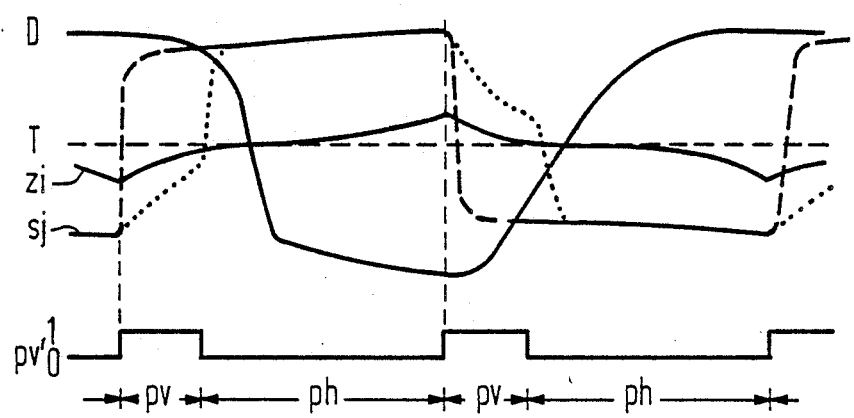
FIG. 5 is a graphic illustration of signals available in the circuits of FIGS. 3 and 4.

FIG. 5 shows a fundamental illustration of signal curves that can derive in an output amplifier circuit Ai of FIG. 3. FIG. 5 is thereby based on a signal curve on the matrix column line sj (FIGS. 1 and 2) shown on the curve sj which may be based on a bit sequence -1-0-, whereby modifications in the signal curve dependent on the operating mode of the input driver are indicated in broken lines and dotted lines. The voltage curve deriving at the inverter input zi (FIG. 3) is then shown with the curve zi in FIG. 5, and, finally, the curve D in FIG. 5 shows a curve in the output amplifier circuit Ai of FIG. 3 at the output of the inverter J and, therefore, at the input D of the following D flip-flop K. The switching threshold of the inverter J (FIG. 3) is indicated with a curve T shown in broken lines in FIG. 5.

The same basic voltage curves as shown in FIG. 5 also occur given construction of the output amplifier circuit ai in the manner illustrated in FIG. 4. In the output amplifier circuit ai of FIG. 4 which corresponds to the circuit arrangement of FIG. 3 in terms of the network of a CMOS inverter J and a D flip-flop DK and in view of the connection of the control electrode of the switching transistor S, the switching transistor S again has one primary electrodes connected to the inverter input zi, but now has its other primary electrode connected to the output b of a reference voltage generator B. During the preliminary phase pv (FIG. 5), the matrix row line zi leading to the input of the inverter J is then reloaded via the transmissive switching transistor S to the potential output by the reference voltage generator B which corresponds to the switching threshold of the inverter J. Since this reloading process is now not effected by the inverter J itself, the inverter J can be designed for high values of resistance without the reloading therefore being deteriorated. In the following primary phase ph (FIG. 5), the matrix row line zi leading to the input of the inverter J is reloaded to the potential corresponding to the bit through-connected therewith, proceeding from the associated column line sj (FIGS. 1 and 2) via the switch element Kij (FIGS. 1 and 2) in the same manner as already set forth above with respect to FIG. 3.

As may also be seen from FIG. 4, a CMOS inverter with negative feedback dimensioned in the same manner as the inverter J can be provided as the reference voltage generator B, this being blocked by a capacitor in order to achieve a low dynamic internal resistance. A differential amplifier with negative feedback (switched as a voltage follower) can also likewise be inserted into the connection leading from the J inverter J to the capacitor; this, however, is not shown in detail in FIG. 4. As indicated in FIG. 4, a shared reference voltage generator B can also be provided for a plurality of switching transistors S; without being shown in detail in FIG. 4, a plurality of reference voltage generators can also be provided distributed in a broadband switching equipment constructed in accordance with the present invention.

In the exemplary embodiments illustrated in FIGS. 3 and 4, a respective D flip-flop DK is provided as a holding element in the iterative network of a CMOS inverter and a holding element. However, the invention is not limited thereto; on the contrary, the holding element can also be realized in some other manner, for example by a capacitor which can, in turn, be realized with the input capacitance of a further element can also be provided instead of the single CMOS inverter.

Although we have described our invention by reference to particular illustrative embodiments, as mentioned above, many changes and modifications may become apparent to those skilled in the art without departing from the spirit and scope of the invention. We therefore intend to include within the patent warranted hereon all such changes and modifications as may reasonably and properly be included within the scope of our contribution to the art.

We claim:

1. In a broadband signal switching apparatus having a crosspoint matrix construction using field effect transistor devices, the matrix including a plurality of input lines each having a resistance and extending in one direction, and a plurality of output lines each temrinating in an output terminal extending in another direction and intersecting said input lines to form crosspoints, and in which a plurality of first selection lines extend parallel to said output lines and a plurality of second selection lines extend parallel to said input lines, said selection lines also extending through said crosspoints so that a bit at a potential at a selected input line is conducted via said crosspoint to a selected output line, the improvement comprising:

a plurality of crosspoint switches, each of said crosspoint switches located at a respective crosspoint and having a control electrode, and a controlled path connected between an input line and an output line intersecting at the crosspoint at which said crosspoint switch is located, said controlled path having a high forward resistance in the conducting state in comparison to the resistance of the matrix input line connected thereto;

a plurality of output amplifiers, each of said output amplifiers having an input and an output connected in a respective output line and comprising a network of an inverting complementary metal-oxide-semiconductor logic element, a network switch and a holding element, said holding element having a signal input, a clock input, and an output forming said output of said output amplifier, said logic element having an input forming said input of said output amplifier, a switching threshold and an output connected to said signal input of said holding element, said network switch having a controlled switching path connected between said input of said output amplifier and a reference voltage source, and a control electrode controlling said switching path connected to a clock line and to said clock input of said holding element, said switching path having a low forward resistance in comparison to the resistance of said crosspoint switch for the respective output line; and means for charging said clock line with a clock signal subdividing a bit switching time interval into a preliminary phase and an actual switching phase, said clock signal rendering said switching path of said network switch conductive during said preliminary phase to reset the respective output line substantially to the potential of the switching threshold of said logic element to prepare said logic element for reloading, proceeding from said potential, by said crosspoint switch during said actual switching phase to a potential corresponding to a bit conducted to the output amplifier by the crosspoint switch respectively connected thereto.

2. The improved broadband switching apparatus of claim 1, wherein:
said logic element comprises a complementary metal-oxide-semiconductor inverter.

3. The improved broadband switching apparatus of claim 1, further comprising a single reference voltage generator means connected to all of said output amplifiers functioning as said voltage source for providing a reference voltage to said second primary electrode in each output amplifier.

4. The improved broadband switching apparatus of claim 1, wherein:
said holding element comprises a D flip-flop.

5. The improved broadband switching apparatus of claim 1, wherein:
said second primary electrode is connected to the output of the logic element.

6. The improved broadband switching apparatus of claim 1, further comprising a plurality of reference voltage generator means respectively connected to at least a portion of said plurality of output amplifiers for functioning as said voltage source providing a reference voltage to said second primary electrode in each output amplifier in said portion of said plurality of output amplifiers.

7. The improved broadband switching apparatus of claim 6, wherein:
said reference voltage generator means comprises a complementary metal-oxide-semiconductor inverter with negative feedback.

8. The improved broadband switching apparatus of claim 6, wherein:
each of said reference voltage generator means comprises a complementary metal-oxide-semiconductor inverter with negative feedback.

* * * * *